(12) United States Patent
Chappell

(10) Patent No.: US 8,548,760 B2
(45) Date of Patent: Oct. 1, 2013

(54) DETECTING NONLINEARITY IN A CABLE PLANT AND DETERMINING A CABLE LENGTH TO A SOURCE OF THE NONLINEARITY

(75) Inventor: Daniel K. Chappell, Greenwood, IN (US)

(73) Assignee: JDS Uniphase Corporation, Milpitas, CA (US)

( * ) Notice: Subject to any disclaimer, the term of this patent is extended or adjusted under 35 U.S.C. 154(b) by 613 days.

(21) Appl. No.: 12/533,789

(22) Filed: Jul. 31, 2009

(65) Prior Publication Data
US 2010/0070228 A1      Mar. 18, 2010

Related U.S. Application Data

(60) Provisional application No. 61/097,702, filed on Sep. 17, 2008.

(51) Int. Cl.
*G01R 31/08* (2006.01)
(52) U.S. Cl.
USPC ............... 702/58; 702/59; 702/79; 702/97; 702/159; 702/185; 702/199; 324/512; 324/528; 324/533; 324/534; 725/107
(58) Field of Classification Search
USPC ............... 702/58, 59, 66, 67, 69, 71, 76, 79, 702/90, 94, 97, 158, 159, 191, 193, 199, 702/185; 324/512, 528, 533, 534; 725/107
See application file for complete search history.

(56) References Cited

U.S. PATENT DOCUMENTS

| 6,151,559 | A | 11/2000 | Williams | 702/58 |
|---|---|---|---|---|
| 6,570,394 | B1 | 5/2003 | Williams | 324/620 |
| 6,697,768 | B2 | 2/2004 | Jones et al. | 702/189 |
| 6,885,954 | B2 | 4/2005 | Jones et al. | 702/79 |
| 6,934,655 | B2 | 8/2005 | Jones et al. | 702/108 |
| 6,947,857 | B2 | 9/2005 | Jones et al. | 702/65 |
| 7,024,680 | B2 | 4/2006 | Howard | 725/107 |
| 7,334,253 | B2 | 2/2008 | Howard | 725/111 |
| RE40,322 | E | 5/2008 | Williams | 324/620 |
| 2004/0245995 | A1 | 12/2004 | Williams | 324/512 |

(Continued)

FOREIGN PATENT DOCUMENTS

| WO | 00/57571 | 9/2000 |
|---|---|---|
| WO | 2006/091708 | 8/2006 |

OTHER PUBLICATIONS

Report on Common Path Distortions by Bharat Patel Date: Feb. 3, 1998 Dept.: Network Development.

*Primary Examiner* — Alexander H Taningco
*Assistant Examiner* — Paul D Lee
(74) *Attorney, Agent, or Firm* — Matthew A. Pequignot; Pequignot + Myers LLC

(57) ABSTRACT

An apparatus and a method for detecting a nonlinearity in a cable plant and for determining cable length to a source of the nonlinearity are disclosed. Upstream signal peaks are detected by averaging upstream signal waveforms. The upstream signal peaks are generated at the source of the nonlinearity from naturally occurring downstream signal peaks propagating in the cable plant. The downstream signal peaks occur due to constructive superposition of the downstream channel signals. Acquisition of the upstream signal waveforms is triggered by the downstream signal peaks. The cable length to the source of nonlinearity is determined from a time delay between the downstream signal peaks and the upstream signal peaks.

20 Claims, 12 Drawing Sheets

(56) References Cited

U.S. PATENT DOCUMENTS

| | | | |
|---|---|---|---|
| 2006/0007959 A1* | 1/2006 | Merriam, Jr. | 370/487 |
| 2006/0248564 A1 | 11/2006 | Zinevitch | 725/121 |
| 2008/0008213 A1* | 1/2008 | Blancha et al. | 370/503 |

* cited by examiner

DETECTING NONLINEARITY IN A CABLE PLANT AND DETERMINING A CABLE LENGTH TO A SOURCE OF THE NONLINEARITY

CROSS-REFERENCE TO RELATED APPLICATIONS

The present invention claims priority from U.S. Provisional Patent Application No. 61/097,702 filed Sep. 17, 2008, which is incorporated herein by reference for all purposes.

TECHNICAL FIELD

The present invention relates to cable system service and diagnostics equipment and methods, and in particular to equipment and methods for detecting a nonlinearity, such as common path distortion, and for determining a cable length to a source of the nonlinearity.

BACKGROUND OF THE INVENTION

In a cable system, a network of interconnected electrical cables, referred to as a cable plant, is commonly used to deliver information to subscribers. A cable plant enables a broadband transmission of signals, such as television signals, from a head end facility to a multitude of home receivers. A broadband coaxial cable is advantageously used in this application because it supports a wide frequency bandwidth and provides signal shielding at a moderate cost in comparison to other media. The wide frequency bandwidth permits definition of a substantial number of information channels on the coaxial cable thus allowing simultaneous broadcasting of many channels.

Cable systems have, in recent years, moved beyond merely broadcasting analog television signals over the cable to subscribers in their homes. Digital video services have become more popular than analog television services due to more efficient bandwidth utilization, and due to their intrinsic high-definition video (HDTV) capabilities. Further, a subscriber of a community antenna television (CATV) network nowadays has a transceiver, or a modem, which allows the transmission of digital signals upstream to the head end of the network. Among many services the subscribers have access to by having the transceiver are: an Internet service, a home shopping service using a television catalogue, and a voice-over-IP phone service.

In bidirectional cable networks, the upstream and the downstream signals occupy separate frequency bands called upstream and downstream spectral bands. In the United States, the downstream spectral band typically spans from 50 MHz to 860 MHz, while the upstream spectral band spans from 5 MHz to 42 MHz. Many downstream information channel signals, each channel occupying a separate 6 MHz sub-band, co-propagate in the downstream spectral band, and many upstream signals co-propagate in the upstream spectral band. The frequency separation of the upstream and the downstream signals allows bidirectional amplification of these signals propagating in a common cable in opposite directions.

The increased cable bandwidth utilization and the bidirectional use of cable plants have increased sensitivity of cable networks to network impairments. One such impairment, affecting mostly upstream signals, is common path distortion (CPD). Although CPD varies in severity and manifests itself in many different ways, it has a very distinctive spectral signature. Typically, CPD is characterized by a significant rise of the noise floor across the upstream spectral band. The rise of the noise floor is accompanied by spectral beats spaced apart at 6 MHz intervals. The spectral beats also occur in the upstream spectral band. CPD can cause a major reduction of carrier-to-impairment power ratios, leading to errors in upstream digital transmissions.

CPD is a signal distortion due to a nonlinear response of an element disposed in a common path of a bidirectional cable network. The common path means a path shared by the upstream and the downstream signals propagating in the network. It is well known that a sinusoidal signal at a single frequency, upon propagating through a component or a module having a nonlinear transfer function, gives rise to so called harmonics, or signals at multiples of the signal frequency. When two single-frequency signals co-propagate through such a nonlinear component or a module, signals at a differential, or "beat" frequency and at a sum frequency also appear, in addition to the harmonics. A term "frequency mixing" is sometimes used to describe these nonlinear phenomena. Due to the frequency mixing, signals in the upstream spectral band give rise to spurious noise in the downstream spectral band, and vice versa, resulting in a rise of a noise floor in both spectral bands. In practice, the rise of a noise floor in the upstream spectral band is much more pronounced than in the downstream spectral band because a signal in the downstream spectral band has a much higher total power and a much broader spectral content than a signal in the upstream spectral band.

One well-known source of nonlinearity is a radio-frequency (RF) amplifier used to amplify signals in a cable system. Fortunately, individual RF amplifier modules are unidirectional and therefore are not disposed in the common path of a cable plant. Even when the frequency mixing takes place in an RF amplifier, the generated harmonics and frequency beats are filtered out by diplex filters used to separate the upstream and the downstream signals counter-propagating in the cable plant. Another source of nonlinearity is a regular connector used to connect two or more cables together. A thin metal oxide layer, gradually developing on a surface of contacting metal parts of the connector, acts as a diode, and because a diode is a nonlinear device, the oxidized connector becomes a source of nonlinearity capable of mixing frequencies of signals propagating therethrough. If the oxidized connector is disposed in the common path of the upstream and the downstream signals, it becomes a source of CPD. Many hundreds and even thousands of connectors are typically installed in a cable plant. Some are installed in areas that are not completely weather-proof, which facilitates metal oxidation; some are installed in subscribers' premises, which are not readily accessible. Multitude and limited accessibility of connectors and other network components and modules make a task of locating a CPD source particularly difficult.

The problem of locating a CPD source in a cable system has been recognized in the art. The prior-art approaches can be broken down into two categories. In approaches of the first category, an active probing signal is generated at a head end facility of a cable system, and an "echo" signal having a CPD specific spectral signature is detected. A distance to a CPD source is then determined from the arrival time of the "echo" signal. In approaches of the second category, a CPD signal due to a pre-selected pair of downstream channel signals is simulated at the head end, and the result of simulation is correlated with a signal in the upstream spectral band having the upstream signals filtered out. A position of the correlation peak detected is indicative of a distance to a source of CPD.

An approach of the first category is taught by Eastment in a PCT Application WO2000057571 incorporated herein by reference. Referring to FIG. 1A, a frequency diagram is presented showing a downstream spectral band 10 and an upstream spectral band 11, downstream carrier signals 12, an active probe signal consisting of modulated signals 13 and 14 having higher frequencies than the frequencies of the downstream carrier signals 12, and an "echo" CPD signal 15 at a beat frequency between the signals 13 and 14. In operation, the modulated signals 13 and 14 are injected into the downstream path of the cable network, and the CPD signal 15 is detected in the upstream spectral band 11. The CPD signal 15 is correlated with the signals 13 and 14, so as to determine the time delay associated with one or more CPD sources of the cable network. A distance to a CPD source is then calculated from the determined time delay of the CPD signal 15 relative to the modulated signals 13 and 14.

An approach of the second category is taught by Zinevitch in US Patent Application 20060248564 A1, incorporated herein by reference. Referring to FIG. 1B, a frequency diagram is presented showing the downstream spectral band 10 spanning from 50 MHz to 860 MHz and the upstream spectral band 11 spanning from 5 MHz to 50 MHz, non-conterminous downstream channel signals 16 and 17, and a CPD signal 18. Central frequencies of the downstream channel signals 16 and 17 are separated by ΔF. The CPD signal 18 is a second-order nonlinear product of the downstream channel signals 16 and 17 and, therefore, it has a central frequency at ΔF. In operation, a second-order CPD signal is calculated at the head end of the cable network, and the upstream signal is digitized and correlated with the calculated second-order CPD signal. A peak in the correlation function indicates presence of the second-order CPD impairment in the cable network. The position of the peak is used to calculate a cable length to the CPD impairment source.

The prior-art approaches suffer from a number of drawbacks. In approaches of the first category, the central frequencies of the active probing signals, for example the modulated signals 13 and 14 in FIG. 1A, have to be carefully selected so as not to overlap with the existing downstream channel frequencies to avoid signal interference. Furthermore, the CPD signal 15 of FIG. 1A has to be at a frequency not already occupied at the moment of the measurement by existing upstream signals, otherwise the upstream signal transmission can be disrupted. Disadvantageously, the approaches of both categories require complicated electronic equipment for analog and digital processing of modulated RF signals. For example, in a device taught by Zinevitch, a complicated adaptive filter is provided for filtering out the upstream channel signals, and a digital signal processor is provided for calculating the correlation function.

Accordingly, it is a goal of the present invention to provide an apparatus and a method for detecting nonlinearity in a cable plant and determining a cable length to a source of the nonlinearity, that is simple, inexpensive, and does not require probe signals to be injected into the network.

SUMMARY OF THE INVENTION

The present invention employs high-amplitude voltage peaks, or high-amplitude electrical pulses that naturally occur in the downstream signal due to a constructive superposition of the downstream channel radio frequency (RF) signals. The high-amplitude electrical pulses cause generation of upstream common path distortion (CPD) pulses. By determining a time delay between the high-amplitude downstream pulses and CPD upstream pulses, a cable length to a CPD source can be determined.

In accordance with the invention there is provided a method for determining a cable length between a test point and a source of nonlinearity in a cable plant for propagating upstream and downstream signals, the method comprising:
  (a) detecting a downstream signal peak at the test point of the cable plant;
  (b) upon detecting the downstream signal peak in step (a), acquiring a waveform of the upstream signal at the test point;
  (c) repeating steps (a) and (b);
  (d) averaging the waveforms acquired, to obtain an averaged waveform of the upstream signal;
  (e) detecting an upstream signal peak in the averaged waveform of the upstream signal; and
  (f) determining the cable length between the test point and the source of nonlinearity, from a time delay between the downstream and the upstream signal peaks.

In accordance with another aspect of the invention there is further provided a method for detecting a common path distortion signal in a cable plant for propagating upstream signals in an upstream spectral band and downstream signals in a downstream spectral band, the method comprising:
  (a) comparing a signal amplitude in the downstream spectral band to a pre-determined threshold value, and generating a triggering pulse when the signal amplitude exceeds the pre-determined threshold value;
  (b) acquiring a waveform of a signal in the upstream spectral band, upon triggering by the triggering pulse generated in step (a);
  (c) repeating steps (a) and (b);
  (d) averaging the waveforms acquired, to obtain an averaged waveform of the signal in the upstream signal band; and
  (e) detecting a common path distortion signal, by detecting a peak in the averaged waveform.

In accordance with another aspect of the invention there is further provided a method for detecting a common path distortion signal in a coaxial cable plant for carrying downstream channels in a downstream spectral band and upstream channels in the upstream spectral band, the method comprising:
  (a) digitizing, at a clock frequency, an electrical signal in the upstream spectral band;
  (b) comparing an electrical signal amplitude in the downstream spectral band to a pre-defined threshold value, and generating a triggering pulse upon a signal peak event at which the signal amplitude in the downstream spectral band exceeds the pre-determined threshold value;
  (c) upon triggering by the triggering pulse of step (b), storing a succession of N electrical signal values digitized in step (a), in a memory buffer, wherein N is an integer positive number;
  (d) repeating steps (b) and (c) M−1 times, wherein M is an integer positive number; and
  (e) averaging the M successions of N electrical signal values, so as to obtain a succession of N averaged values corresponding to a waveform of the common path distortion signal.

In accordance with another aspect of the invention there is further provided an apparatus for detecting a common path distortion signal in a coaxial cable plant for propagating downstream channel signals in a downstream spectral band and upstream channel signals in an upstream spectral band, the apparatus comprising:
  a comparator for providing trigger pulses upon detecting high-magnitude downstream electrical pulses due to a constructive superposition of the downstream channel signals in the downstream spectral band, by comparing an electrical signal amplitude in the downstream spectral band to a pre-defined threshold value, and by generating a trigger pulse when the signal amplitude in the downstream spectral band exceeds the pre-determined threshold value;

an ADC for digitizing, at a clock frequency, an electrical signal in the upstream spectral band;

a memory buffer coupled to the ADC, for storing, upon receiving the trigger pulses from the comparator, waveforms of the digitized electrical signal, wherein the waveforms are of a pre-defined length; and an averaging unit coupled to the memory buffer, for averaging the waveforms stored in the memory buffer, so as to obtain an averaged waveform of the electrical signal in the upstream spectral band, wherein in operation, the averaged waveform has a peak corresponding to common-path distortion signals induced by the high-magnitude downstream electrical pulses detected by the comparator.

In accordance with another aspect of the invention there is further provided an apparatus for determining a cable length between a test point and a source of nonlinearity in a cable plant for propagating upstream and downstream signals, the apparatus comprising:

a peak detector for detecting a downstream signal peak at the test point of the cable plant;

a waveform acquisition unit coupled to the peak detector, for acquiring, upon triggering by the peak detector, waveforms of the upstream signal at the test point; and a processing unit coupled to the waveform acquisition unit, for averaging the waveforms acquired, to obtain an averaged waveform of the upstream signal; for detecting an upstream signal peak in the averaged waveform of the upstream signal; and for determining the cable length between the test point and the source of nonlinearity, from a time delay between the downstream and the upstream signal peaks.

BRIEF DESCRIPTION OF THE DRAWINGS

Exemplary embodiments will now be described in conjunction with the drawings in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

In the present invention, upstream signal peaks are detected by averaging upstream signal waveforms. The upstream signal peaks are induced at a remote source of nonlinearity such as common path distortion (CPD) by high-amplitude downstream voltage peaks. The high-amplitude downstream voltage peaks occur naturally in the downstream signal due to constructive superposition of the downstream radio frequency (RF) channel signals.

Figure 1A:
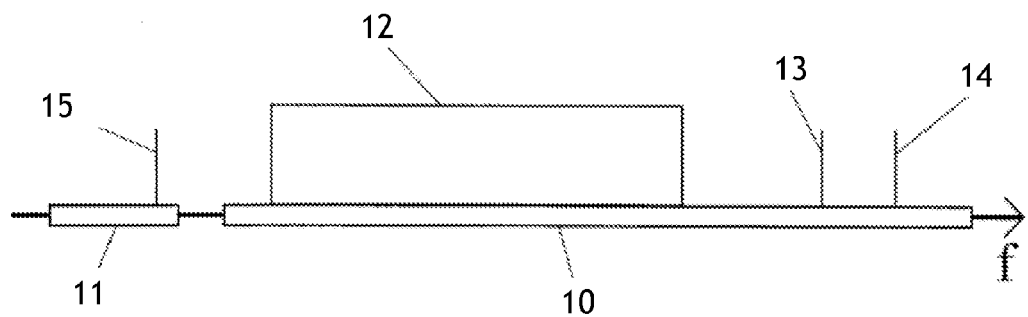
FIGS. 1A and 1B are frequency diagrams showing spectral bands and signals used in prior-art methods of CPD detection.
Figure 1B:
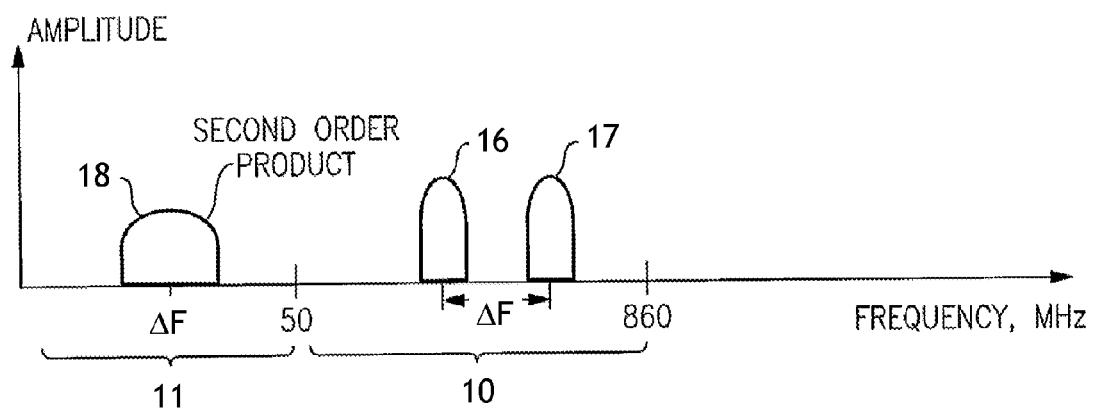
Figure 2:
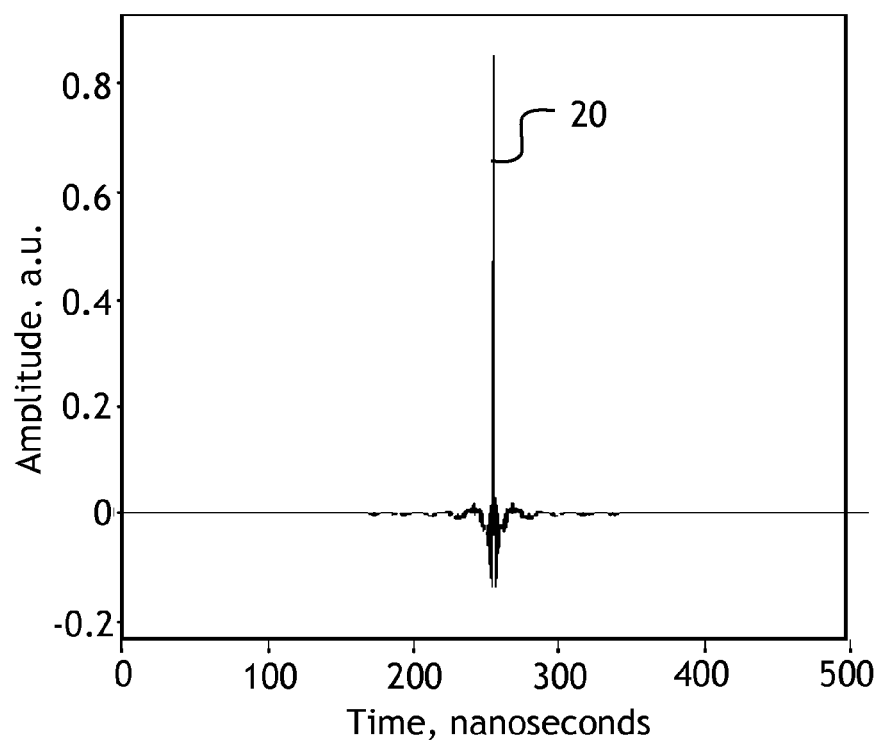
FIG. 2 is a time trace of a simulated short pulse event having a uniform spectral distribution spanning between 50 MHz and 860 MHz.

Referring to FIG. 2, a time trace of a simulated electrical pulse 20 having a uniform spectral power density in a downstream spectral band of 50 MHz to 860 MHz is presented. The pulse 20 represents a high-amplitude downstream voltage peak.

Figure 3:
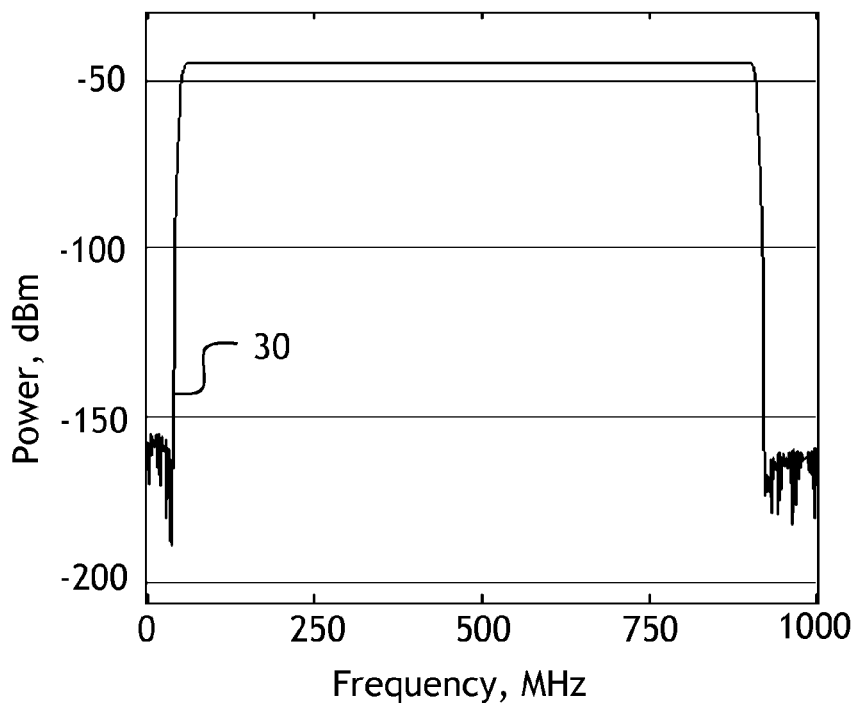
FIG. 3 is spectral plot of the simulated short pulse of FIG. 2.

Turning to FIG. 3, a corresponding spectral plot 30 of the pulse 20 of FIG. 2 is presented. As can be seen from FIG. 3, the signals at frequencies below 50 MHz and above 860 MHz are more than 100 dB below the level of the spectral power within the downstream spectral band.

Figure 4:
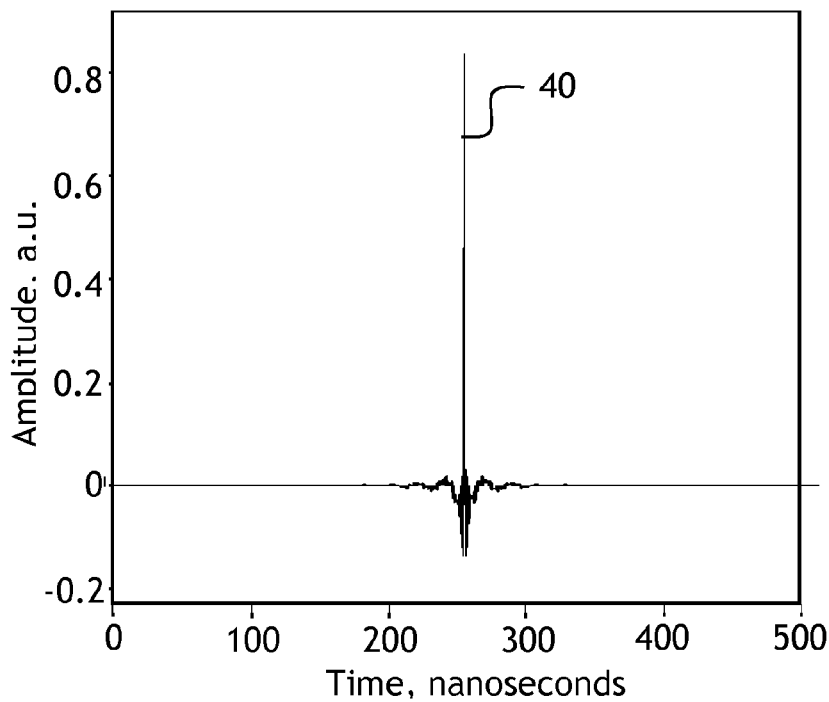
FIG. 4 is a time trace of the simulated short pulse of FIG. 2 distorted in a non-linear device.

Turning now to FIG. 4, a time trace of a simulated short pulse 40 is shown. The pulse 40 is obtained from the pulse 20 by sending the pulse 20 through an amplitude limiter. The amplitude limiter represents in this simulation a nonlinear device acting as a source of CPD.

Figure 5:
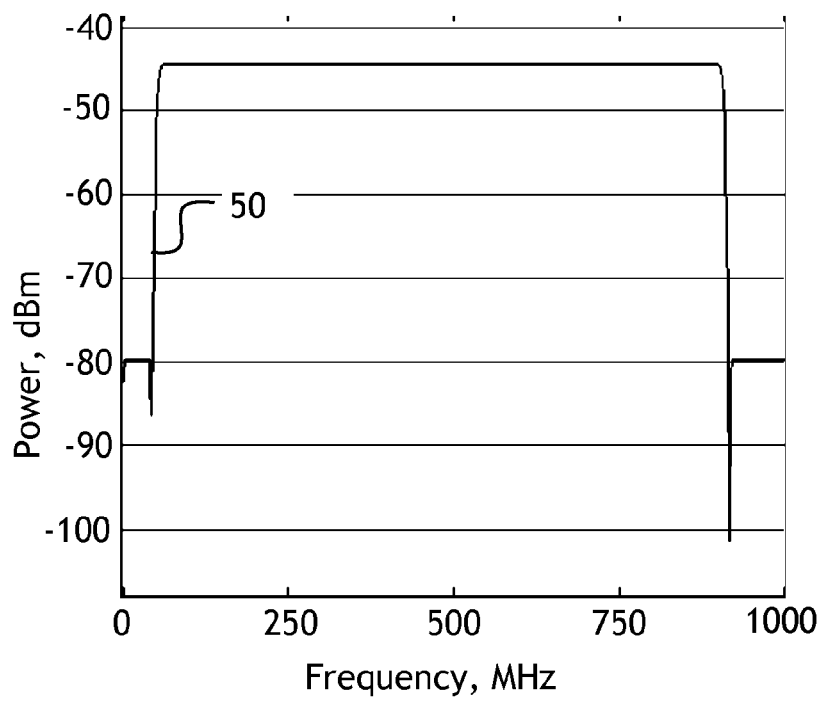
FIG. 5 is spectral plot of the simulated short pulse of FIG. 4.

Referring to FIG. 5, a spectral plot 50 of the simulated short pulse 40 of FIG. 4 is presented. As can be seen from FIG. 5, sending the pulse 20 through the amplitude limiter results in raising the noise floor in the upstream spectral band of 5 MHz to 50 MHz to a level of about 35 dB below the level of the spectral power density of the pulse 20 in the downstream spectral band.

Figure 6:
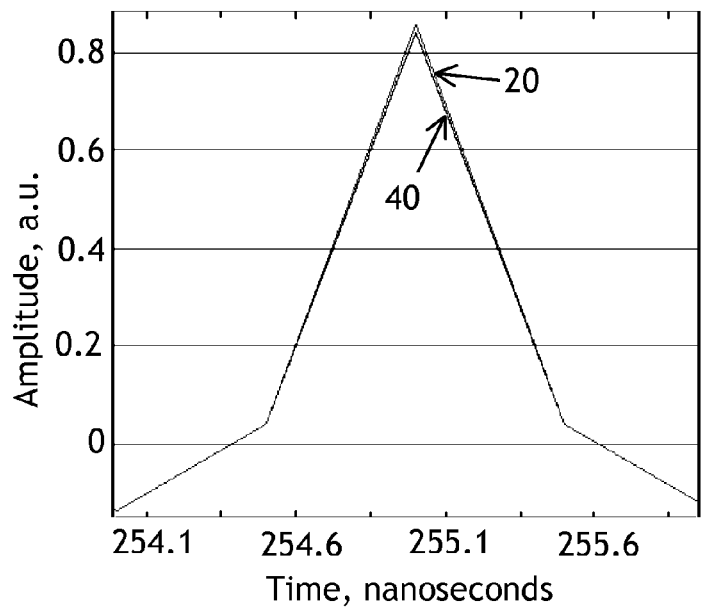
FIG. 6 is a combined time trace of the pulses of FIGS. 2 and 4.
Figure 7:
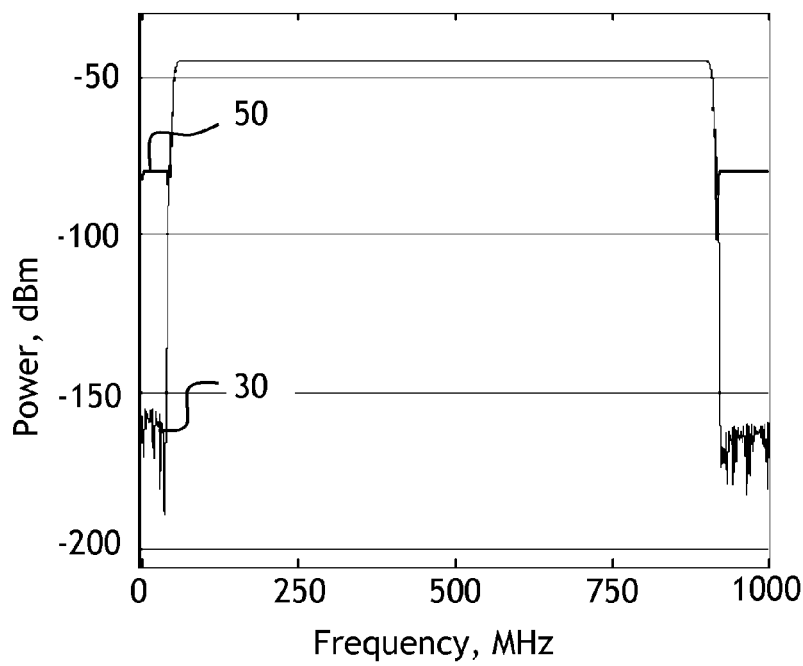
FIG. 7 is a combined spectral plot of FIGS. 3 and 5.

Turning to FIGS. 6 and 7, a combined time trace and a combined spectral plot of the pulses 20 and 40 are shown, respectively. It is seen from FIGS. 6 and 7 that, even though the amplitude of the pulse 20 changes very little upon propagating through the amplitude limiter, the spectral power density in the in the upstream spectral band increases dramatically, leading to CPD impairments of the upstream data transmission.

Figure 8:
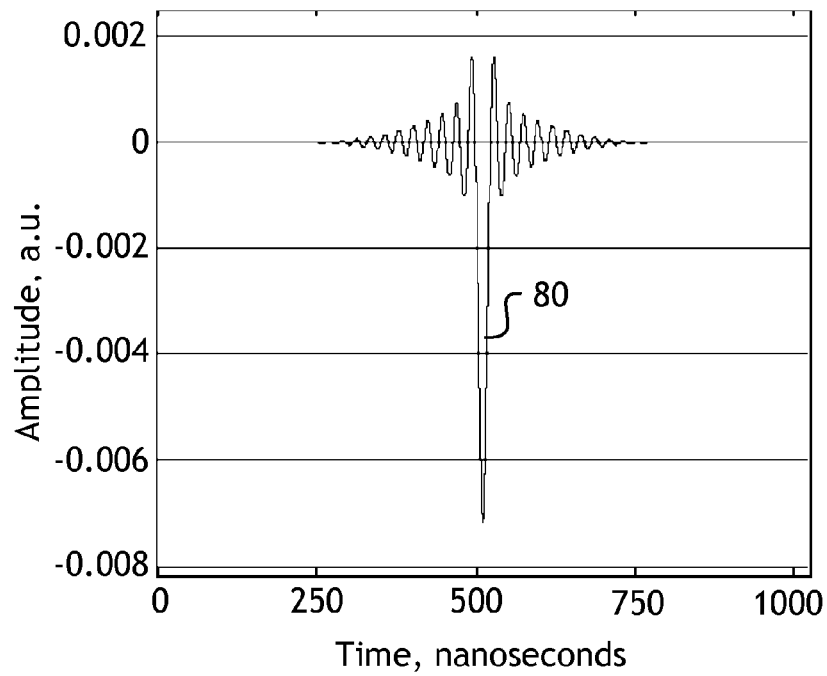
FIG. 8 is a magnified time trace of the pulse of FIG. 4 after removing the downstream spectral components.

Referring now to FIG. 8, a magnified time trace of an upstream pulse 80 is shown. The pulse 80 is obtained from the pulse 40 of FIG. 4 by removing the downstream spectral components of the pulse 40 of FIG. 4. In other words, the upstream pulse 80 is obtained from the pulse 40 of FIG. 4 by sending the pulse 40 through an ideal upstream signal filter having a passband of between 5 MHz and 50 MHz. Thus, the pulse 80 of FIG. 8 represents a CPD pulse in the upstream spectral band.

Figure 9:
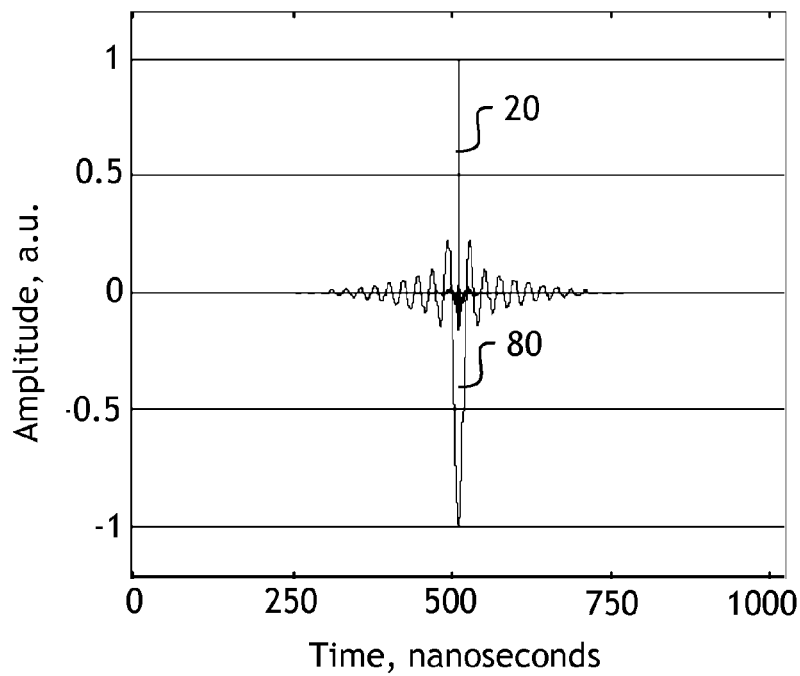
FIG. 9 is a combined time trace of the pulses of FIGS. 2 and 8.

Turning to FIG. 9, a combined time trace is shown having the downstream and upstream pulses 20 and 80 superimposed. The pulses 20 and 80 have been normalized to 1 and −1, respectively. By obtaining an averaged waveform of the upstream pulse 80 upon triggering by the downstream pulse 20, one can obtain an averaged amplitude and a peak position of the upstream pulse 80. From the height of the peak and the peak position of the upstream pulse 80, the strength of the nonlinearity and a cable length to a source of the nonlinearity can be evaluated.

Figure 10:
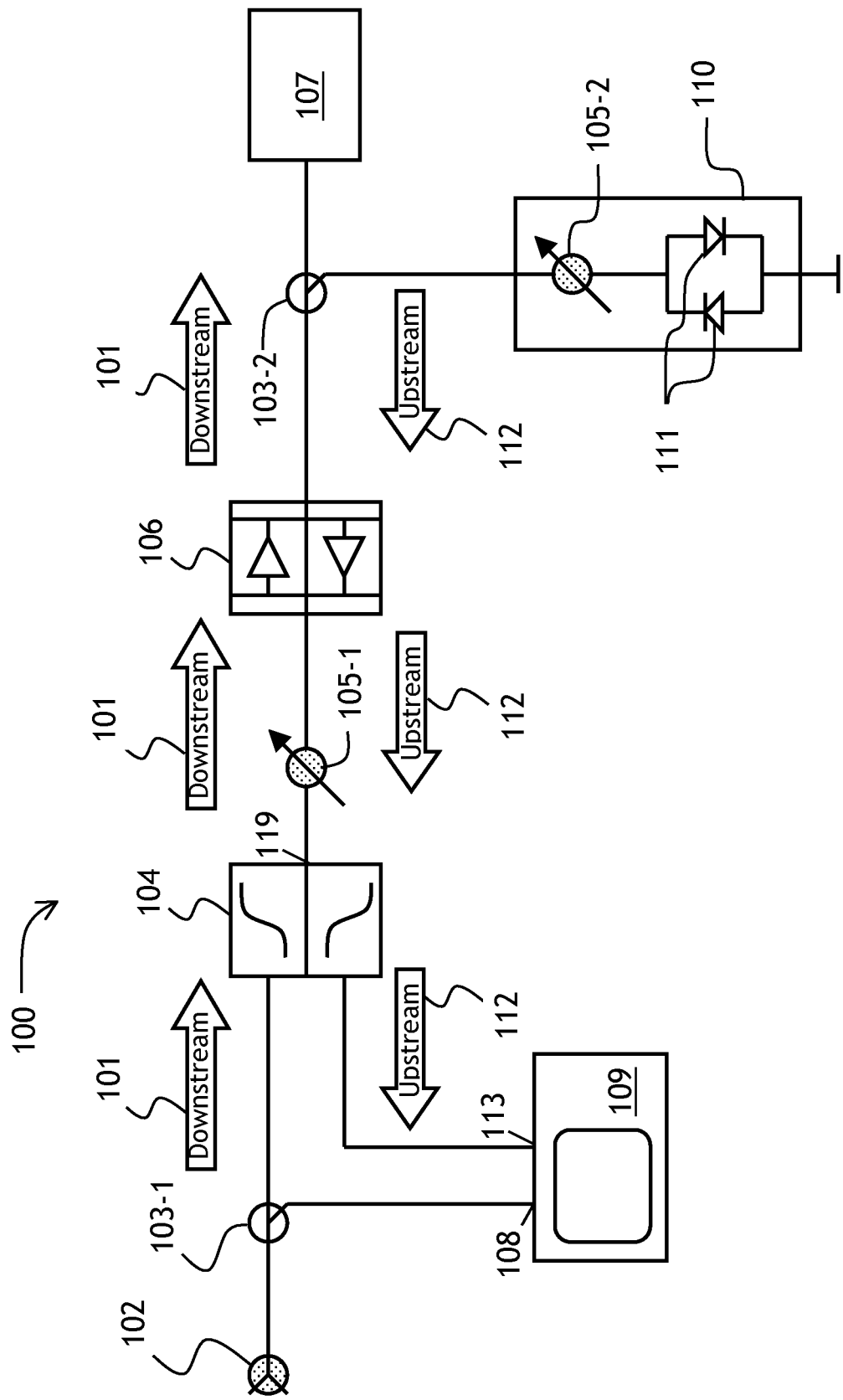
FIG. 10 is a block diagram of an experimental setup for measuring a cable length to a CPD source.

Referring to FIG. 10, a block diagram of an experimental setup 100 for measuring CPD strength and a cable length to a CPD source is shown. The experimental setup 100 represents a CPD detecting apparatus coupled to a cable plant. A downstream signal 101 is a superposition of downstream channel signals, not shown. The signal 101 enters the setup 100 from the cable plant at an input port 102 and propagates through a first signal splitter 103-1, a diplex filter 104 having a common terminal 119, a step attenuator 105-1, a bi-directional community antenna television (CATV) amplifier 106, a second signal splitter 103-2, towards a customer premises equipment (CPE) 107. A fraction of the downstream signal 101, split by the first splitter 103-1, is applied to a first input 108 of a digital oscilloscope 109. A fraction of the downstream signal 101 amplified by the amplifier 106 and split by a second splitter 103-2 is applied to a non-linear device, or CPD simulator 110 having a couple of diodes 111 connected in parallel and a step attenuator 105-2. A nonlinear signal generated in the CPD simulator 110 is mixed by the splitter 103-2 with upstream channel signals generated by the CPE 107, forming an upstream signal 112 that is amplified by the CATV amplifier 106, filtered by the diplex filter 104 and coupled to a second input 113 of the digital oscilloscope 109. The attenuator 105-1 is adjusted to bring an amplitude of the downstream signal 101 to a low enough level, so that the amplifier 106 operates in a linear regime. The attenuator 105-2 is adjusted to bring an amplitude of the CPD signal to a level convenient for CPD measurements.

Figure 11:
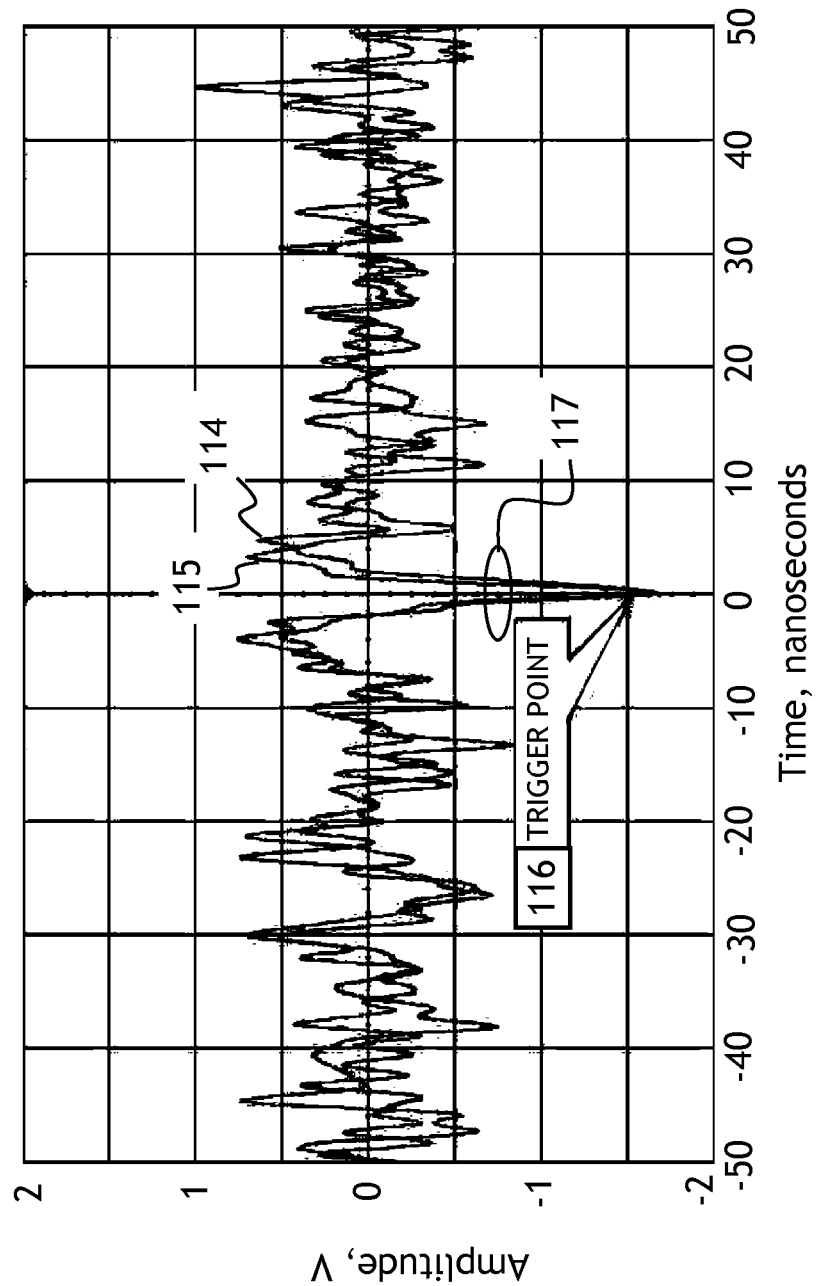
FIG. 11 is a time trace of a downstream signal in the setup of FIG. 10.

Turning now to FIG. 11, waveforms 114 and 115 of the downstream signal 101 applied to the first input 108 of the oscilloscope 109 are presented. The acquisition of the waveforms 114 and 115 is triggered at a trigger point 116 corresponding to downstream signal peaks 117 due to a constructive superposition of the downstream channel signals in the downstream spectral band between 50 MHz and 860 MHz. The peaks 117 have a negative amplitude. Peaks having a positive amplitude can also be used.

Figure 12:
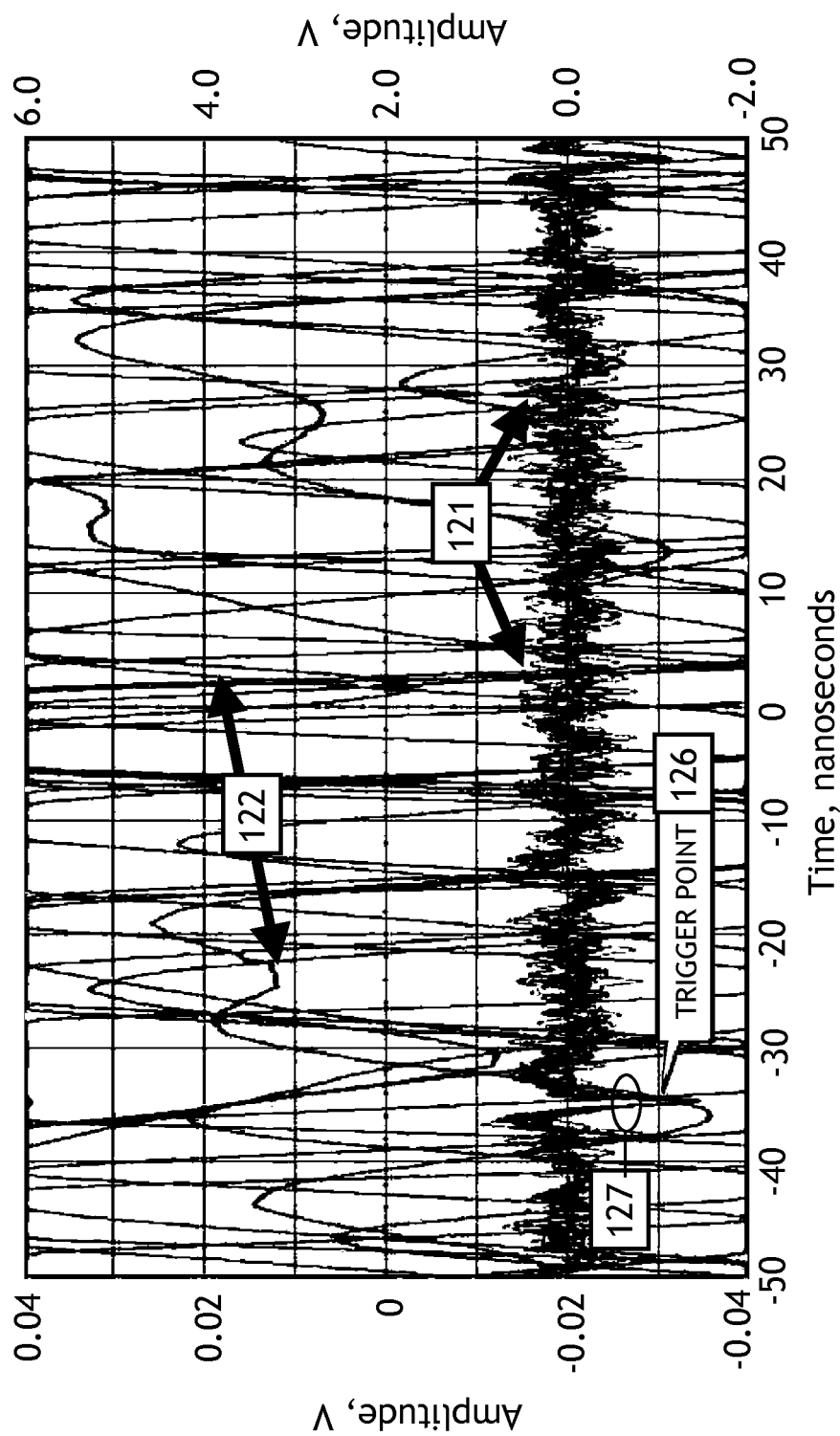
FIG. 12 is a superimposed time trace of downstream and upstream signals in the setup of FIG. 10.

Referring to FIG. 12, superimposed waveforms 121 and 122 of the downstream and the upstream signals 101 and 112 are presented, respectively. The acquisition of the waveforms 121 and 122 is triggered at a trigger point 126 corresponding to downstream signal peaks 127 appearing due to a pseudo-random constructive superposition of the downstream channel signals in the downstream spectral band. The trigger point 126 and the peaks 127 correspond to the trigger point 116 and the peaks 117 of FIG. 11. The vertical scales for the waveforms 121 and 122 are different: for the trace 121, the right-side scale of −2V to 6V, and for the trace 122, the left-side scale of −40 mV to +40 mV is used. The waveforms 122 appear random because the upstream signal 112 contains upstream channel signals, for example, DOCSIS digital cable modem signals, that are not synchronized to the trigger point 126. However, after averaging the traces 122, a pattern emerges.

Figure 13:
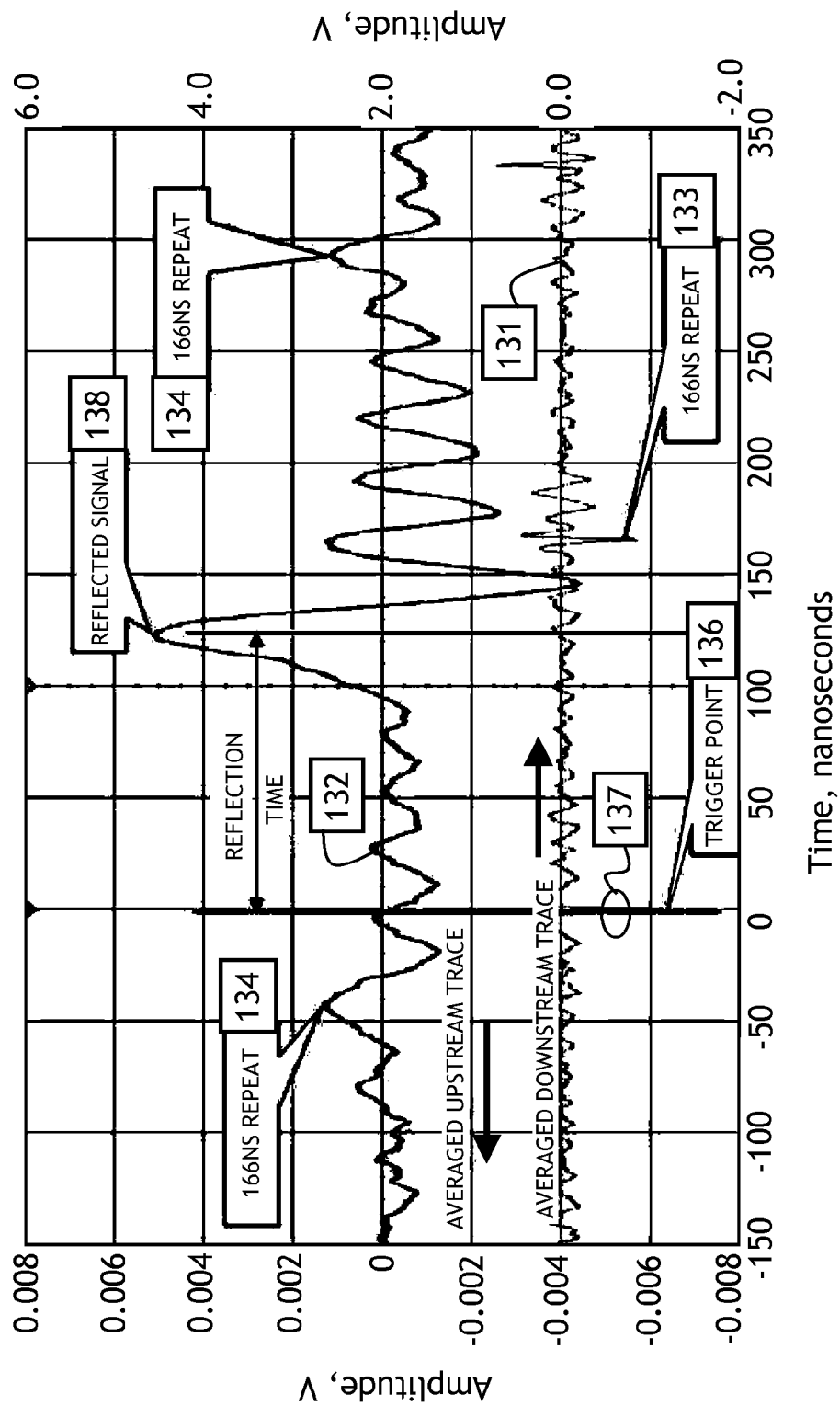
FIG. 13 is an averaged time trace of the downstream and the upstream signals in the setup of FIG. 10.

Turning now to FIG. 13, averaged superimposed waveforms 131 and 132 of the downstream and the upstream signals 101 and 112 are presented, respectively. The acquisition of the waveforms 131 and 132 is triggered at a trigger point 136 corresponding to a downstream signal peak 137. The waveforms 131 and 132 are a result of averaging of 1024 waveforms of the downstream and the upstream signals 101 and 112, respectively. The waveforms 121 and 122 of FIG. 12 are among those averaged to obtain the corresponding waveforms 131 and 132 of FIG. 13. The scales for the waveforms 131 and 132 are different. The scale for the waveform 131 is from −2 to 6 Volts. The scale for the waveform 132 is from −8 to 8 millivolts. A reflected signal peak 138 is observed in the averaged waveform 132. The reflected signal peak 138 represents CPD signals induced in the CPD source 110 by the high-magnitude electrical pulses represented by the downstream signal peak 137. The CPD signals are generated in the CPD source 110 in a similar manner to the upstream pulse 80 of FIG. 8, which is obtained from the downstream pulse 40 of FIG. 4, as discussed above. The reflected signal peak 138 is delayed relative to the downstream signal peak 137 of the waveform 131 by approximately 125 ns. This time delay is caused by the diplex filter 104, the CATV amplifier 106, and a cable length between the diplex filter 104 and the CPD source 110. Other active and, or reactive components and modules may cause additional delays. These additional delays are known and, therefore, they may be subtracted from the resulting delay to obtain a time delay due to propagation of the upstream and the downstream signals in the cable. The cable length between the diplex filter 104 and the source of CPD 110 may be determined from the delay due to the signal propagation in the cable. The magnitude, or "strength" of CPD can be evaluated from the amplitude of the reflected signal peak 138. The common terminal 119 of the diplex filter 104 of FIG. 10 is a test point at which the waveforms are recorded.

Additional peaks 133 and 134 observed in the averaged waveforms 131 and 132, respectively, are $\frac{1}{6}$ MHz signal beats. A filter can be provided to filter them out, even though no such filter was provided during initial tests using the experimental setup 100 of FIG. 10. During testing, averaging over 500 traces was sufficient to provide a waveform with a detectable peak. Averaging over 1000 traces or more is preferable, because noise level can be further reduced, and the accuracy of measurement improved.

Figure 14:
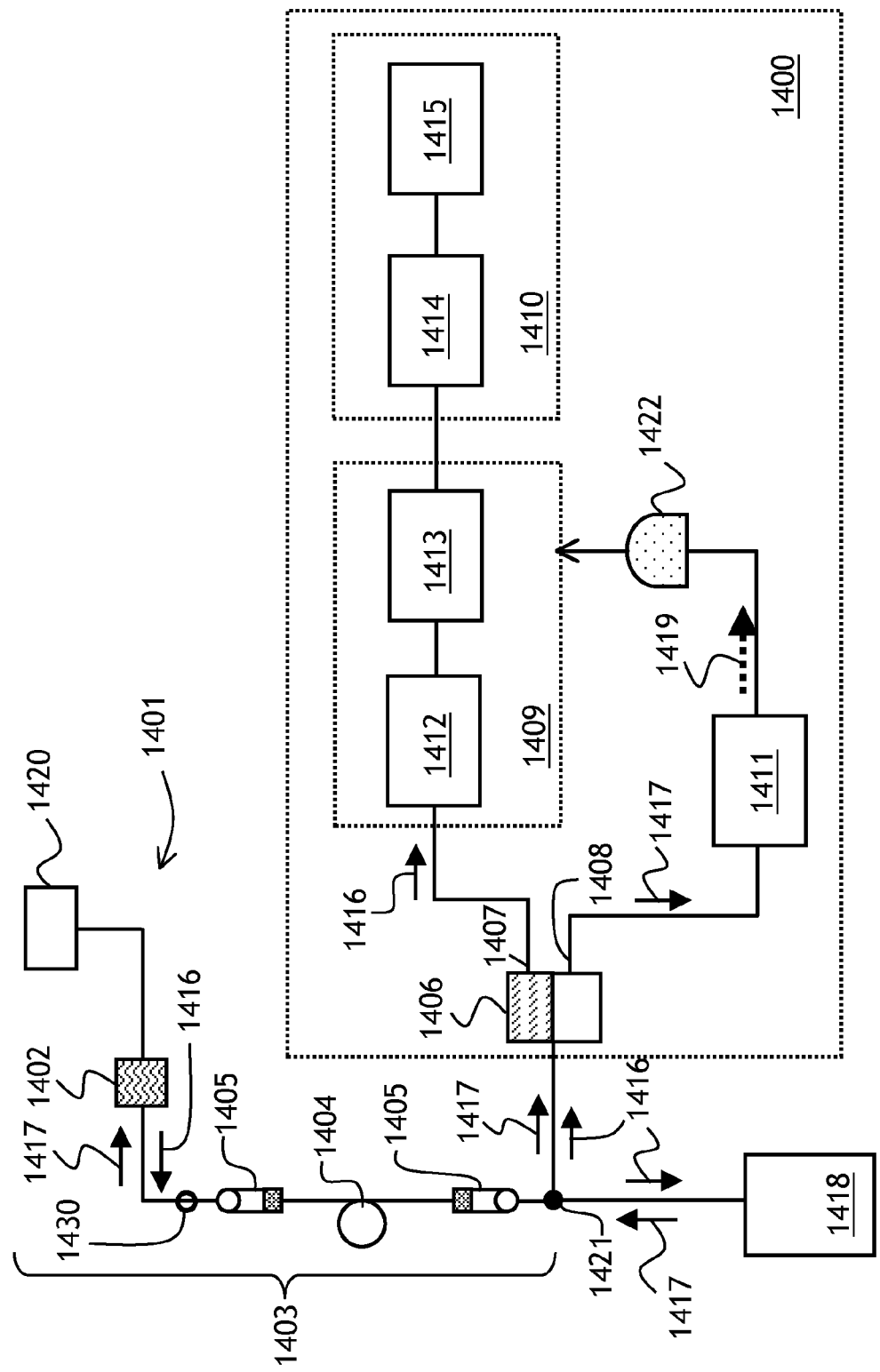
FIG. 14 is a block diagram of another embodiment of the present invention coupled to a cable system.

Referring now to FIG. 14, a block diagram of an apparatus 1400 of an embodiment of the present invention for detecting a nonlinearity in a cable plant 1401 and for determining a cable length to a source 1402 of the nonlinearity is shown. The cable plant 1401 is a part of a hybrid fiber—coax (HFC) network 1403 having an optical fiber link 1404 operationally coupled to the rest of the network through a pair of transponders 1405. The HFC network 1403 has a head end 1418 and customer premises equipment (CPE) 1420. The apparatus 1400 has a diplex filter 1406 coupled to the HFC network 1403 at a test point 1421. The diplex filter 1406 has an upstream spectral band terminal 1407 and a downstream spectral band terminal 1408. The upstream spectral band terminal 1407 of the diplex filter 1406 is coupled to a waveform acquisition unit 1409 coupled to a processing unit 1410. The downstream spectral band terminal 1408 of the diplex filter 1406 is coupled to a peak detector 1411, which is coupled to a delay line 1422, which is coupled to the waveform acquisition unit 1409. The waveform acquisition unit 1409 has an analog-to-digital converter (ADC) 1412 and a memory buffer 1413. The processing unit 1410 has an averaging unit 1414 and a calculation unit 1415. The memory buffer 1413 is preferably a first in, first out (FIFO) memory buffer.

In operation, upstream and downstream signals 1416 and 1417, respectively, propagate in the HFC network 1403 between the head end 1418 and the CPE 1420. On their way, the upstream and the downstream signals 1416 and 1417 are transformed from electrical to optical signals and back by the transponders 1405. At the test point 1421, the upstream and the downstream signals 1416 and 1417 are coupled to the diplex filter 1406, the function of which is to separate the upstream and the downstream signals 1416 and 1417 from each other by frequency. The downstream signal is applied to the peak detector 1411, which generates a trigger pulse, or a triggering signal 1419 upon detecting a peak in the downstream signal 1417. The triggering signal 1419 is applied to the waveform acquisition unit 1409, which acquires, upon receiving the triggering signal 1419 from the peak detector 1411, a waveform of the upstream signal 1416 at the test point 1421. The processing unit 1410 averages the waveforms acquired by the waveform acquisition unit 1409, to obtain an averaged waveform of the upstream signal, such as the waveform 134 of FIG. 13, and detects an upstream signal peak in the averaged waveform of the upstream signal 1416, such as the reflected signal peak 138 of FIG. 13. Further, the processing unit 1410 determines the cable length between the test point and the source of nonlinearity 1402, from a time delay between the downstream and the upstream signal peaks, such as the downstream and the upstream signal peaks 137 and 138 of FIG. 13.

Preferably, the peak detector 1411 has a comparator for comparing an amplitude of the downstream signal 1417 to a pre-defined threshold value and for providing the triggering signal 1419 to the waveform acquisition unit 1409 when the downstream signal amplitude exceeds the pre-defined threshold value. Preferably, the comparator has a circuit for detecting positive downstream signal peaks and a circuit for detecting negative downstream signal peaks, because CPD and other forms of nonlinearity can be generated for both positive and negative signal polarities.

The waveform acquisition unit 1409 has the analog-to-digital converter (ADC) 1412 for digitizing the upstream signal 1416 at the test point 1421, and the memory buffer 1413 coupled to the ADC, for storing the waveform of the upstream signal 1416 upon receiving the triggering signal 1419 from the comparator of the peak detector 1411. Preferably, the ADC 1412 has a sampling frequency that is at least twice higher than a highest frequency of the upstream signal 1416, for example at least 2×50 MHz=100 MHz.

The processing unit 1410 has an averaging unit 1414 unit for averaging waveforms acquired by the waveform acquisition unit 1409, and the calculation unit 1415 for detecting an upstream signal peak in the averaged waveform of the upstream signal 1416, and for determining the cable length between the test point 1421 and the source of nonlinearity 1402. The cable length is determined from a time delay between the downstream and the upstream signal peaks. A single microprocessor can be used in both the averaging unit 1414 and the calculation unit 1415.

The delay unit 1422 delays the triggering signal 1419 by a delay time corresponding to a time of propagation of an optical signal in the optical fiber link 1404. When the delay unit 1422 is used, the time delay due to the optical fiber link 1404 can be effectively subtracted out. In other words, delaying the triggering signal 1419 allows shifting a point from which the cable length will be measured away from the test point 1421. For example, a virtual test point 1430, located on the other side of the optical fiber link 1404, is used as such a starting point of cable length measurement. The optical fiber link 1404 may be a hundred miles long, which creates a considerable time delay. Using the delay unit 1422 allows a significant reduction of waveform length and/or temporal resolution of the waveforms acquired by the waveform acquisition unit 1409. Of course, the delay unit 1422 can also be used for compensating for any other pre-determined delays.

Figure 15:
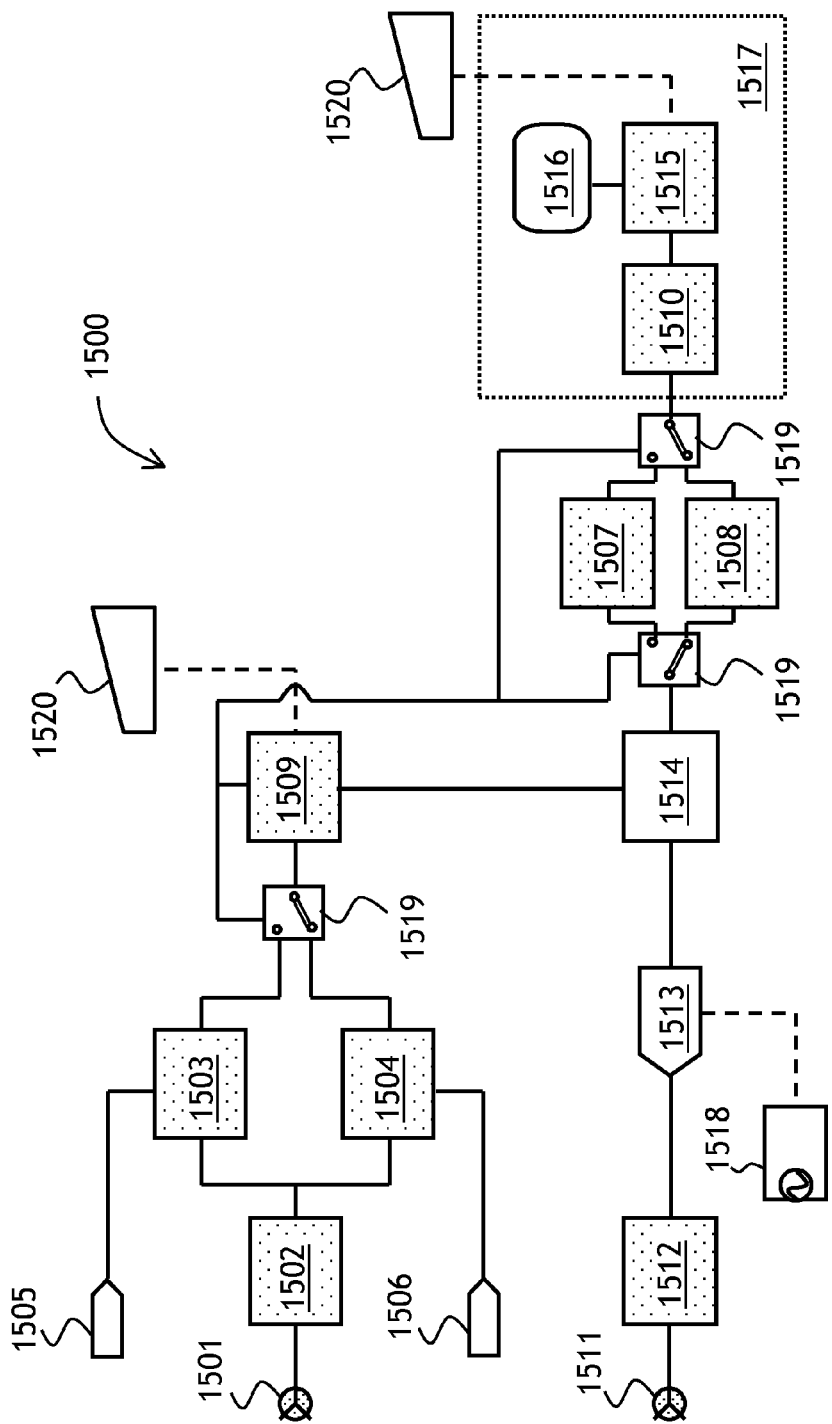
FIG. 15 is a block diagram of another embodiment of the present invention using positive and negative peak detection.

Turning now to FIG. 15, a block diagram of a CPD detection system 1500 of another embodiment of the present invention is shown. The CPD detection system 1500 has a downstream signal coupler 1501, a downstream signal amplifier and conditioner 1502, a positive voltage comparator 1503, a negative voltage comparator 1504, digital to analog (DAC) converters 1505 and 1506, positive and negative averaging units 1507 and 1508, a FIFO trigger controller 1509, an upstream signal coupler 1511, an upstream signal amplifier and conditioner 1512, a high-speed ADC 1513 clocked by a clock source 1518, a FIFO memory buffer 1514, a waveform peak detector 1510, a calculation circuit 1515, and a display unit 1516. The waveform peak detector 1510, the calculation circuit 1515, and the display unit 1516 together form a calculation unit 1517.

In operation, a downstream signal in the downstream spectral band of 50 MHz to 860 MHz is applied to the downstream signal coupler 1501. The downstream signal amplifier and conditioner 1502 amplifies the downstream signal to a level suitable for operation of the positive and the negative voltage comparators 1503 and 1504. The positive and the negative voltage comparators 1503 and 1504 provide trigger pulses upon detecting high-magnitude positive or negative downstream electrical pulses due to a constructive superposition of the downstream RF channel signals in the downstream spectral band. The detection is performed by comparing an electrical signal amplitude in the downstream spectral band with positive and negative threshold values set by DACs 1505 and 1506, and by generating a trigger pulse when the signal amplitude in the downstream spectral band exceeds the threshold values. Further, an upstream signal in the upstream spectral band of 5 MHz to 50 MHz is applied to the upstream signal coupler 1511. The upstream signal amplifier and conditioner 1512 amplifies the upstream signal to a level suitable for operation of the ADC 1513, which digitizes the upstream signal at a frequency of the clock source 1518. The digitized upstream signal waveforms are stored in the FIFO memory buffer 1514, so that the averaging does not have to be performed in real time. The storing is performed upon receiving the trigger pulses from the trigger controller 1509, which receives the trigger pulses from one of the positive or negative comparators 1503 or 1504, depending upon a position of a relay switch 1519, which is controlled by a polarity signal provided by the trigger controller 1509. Preferably, the CPD detection system 1500 has a delay unit disposed between the trigger controller 1509 and the FIFO memory buffer 1514, for delaying the trigger pulses provided by the comparator. The delay unit is not shown in FIG. 15. The delay is selected so as to compensate for signal delays unrelated to signal propagation delay in the cable, for example a delay due to optical signal propagation in the optical link 1404 of the HFC network 1403 of FIG. 14. The magnitude of the delay can be input manually via an input device 1520.

The positive and the negative averaging units 1507 and 1508 average the waveforms stored in the FIFO memory buffer 1514. In the CPD detection system 1500, the position of relay switches 1519 determines whether "positive" or "negative" waveforms, that is waveforms having positive or negative CPD peaks, are averaged. The averaged waveforms are analyzed by the waveform peak detector 1510, which determines a position and a height of the CPD peak in the averaged waveform of the electrical signal in the upstream spectral band. After the position and the height of the CPD peak are determined, the calculation circuit 1515 calculates a strength of CPD in a cable plant from the height of the CPD peak. The calculation circuit 1515 also determines the cable length between the test point coupled to the downstream and the upstream signal couplers 1501 and 1511 and a physical source of common path distortion. To determine the cable length, an index $n_{PEAK}$, denoting the position of the CPD peak in the averaged waveform, is determined. Then, $n_{PEAK}$ is multiplied by a constant $C_1$ to obtain a product and adding a constant $C_2$ to the product. The constants $C_1$ and $C_2$ are selected so as to account for signal propagation delays in reactive and, or active modules and, or cable spans of the cable plant. The velocity of propagation of the signal in the cable can be input manually via the input device 1520. Finally, the results of calculation indicating CPD strength and, or cable length to the CPD source are displayed on the display unit 1516. The waveforms of the downstream and the upstream signals used in the calculation are similar to the waveforms 131 and 132 of FIG. 13. A beat filter, not shown, is preferably disposed in the upstream signal path of the CPD detection system 1500 to filter out the additional peaks 133 and 134 observed in the averaged waveforms 131 and 132, respectively, due to ⅙ MHz signal beats.

Figure 16:
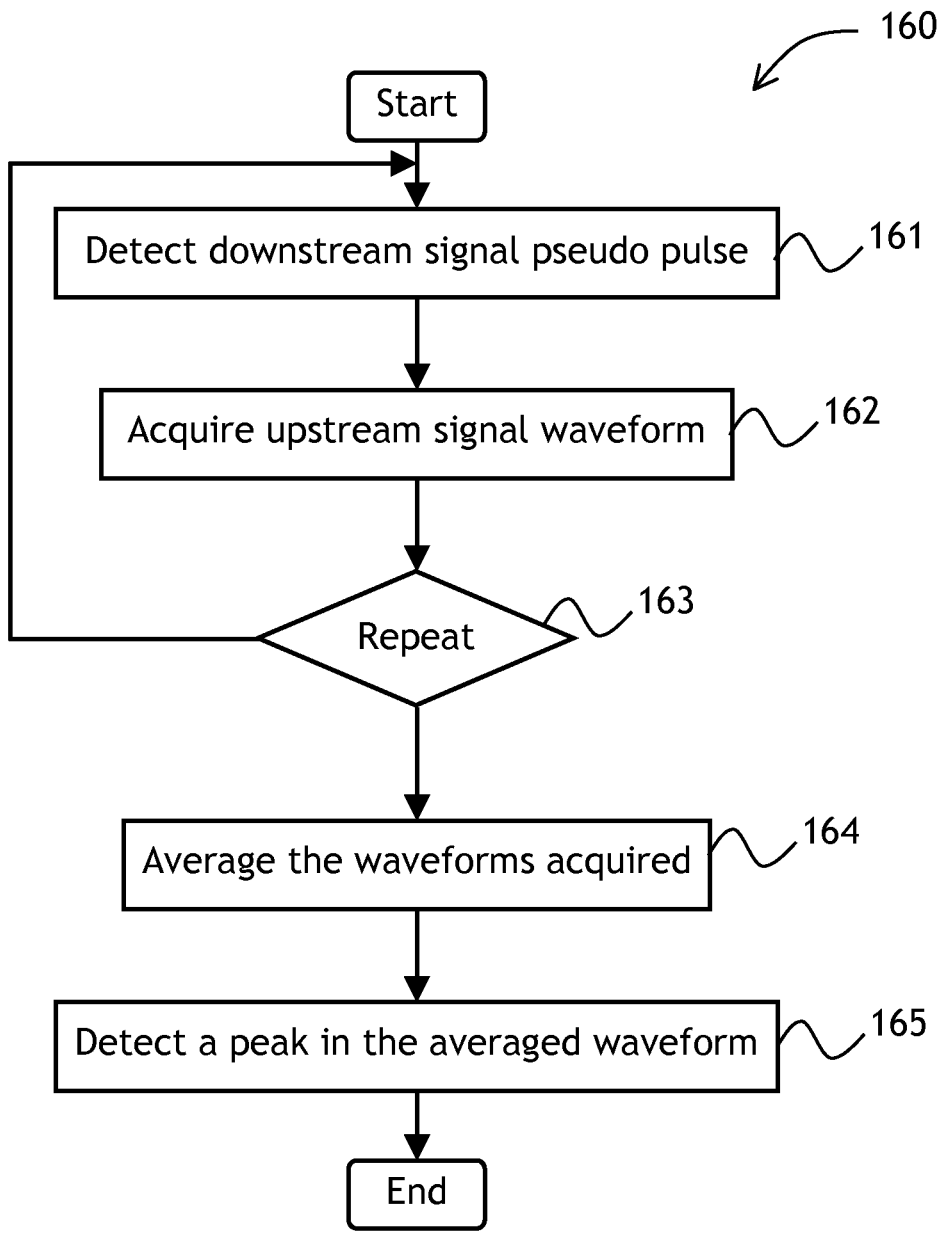
FIG. 16 is a block diagram of a method of the present invention.

Turning now to FIG. 16, a block diagram of an exemplary method 160 of CPD detection in a cable system is shown. Upstream information channel signals are propagating in an upstream spectral band and downstream information channel signals are propagating in a downstream spectral band of the cable system. At a step 161, pseudo random high-magnitude electrical pulses due to a constructive superposition of the downstream RF signals in the downstream spectral band are detected. These pseudo random pulses are detected by comparing a signal amplitude in the downstream spectral band to a pre-determined threshold value, and by generating a triggering pulse when the signal amplitude exceeds the pre-determined threshold value. Upon triggering by the triggering pulse, an upstream signal waveform is acquired at a step 162. A repeat box 163 denotes repeating the steps 161 and 162 for a pre-defined number of times, by the way of a non-limiting example 500 times or more, preferably 1000 times or more, to acquire and store a number of waveforms of the upstream signal upon detecting the high-magnitude electrical pulses. As described above, these high-magnitude electrical pulses are not generated by the CPD detection system. They occur naturally due to multitude of the downstream RF channels present in the cable.

At a step 164, the acquired waveforms are averaged, so as to obtain an averaged waveform. Finally, at a step 165, a peak is detected in the averaged waveform. FIG. 13 can be referred to for illustration of the steps 161 to 165. For example, the downstream signal pseudo pulse is the downstream signal peak 137; the averaged waveform is the waveform 132; and the peak is the CPD reflected signal peak 138. To determine the cable length between the test point at which the waveforms were collected and the source of CPD, a position of the CPD reflected signal peak 138 in the averaged waveform 132 is determined by using a suitable peak search algorithm known in the art. The cable length to the source of CPD is proportional to an integer index $n_{PEAK}$ denoting the position of the CPD reflected signal peak 138 in the averaged waveform 132. The above mentioned constants $C_1$ and $C_2$ defining this proportional dependence are selected so as to take into account signal delays in active and/or reactive components of the cable network.

Obvious modifications of the apparatus 1400 for detecting a nonlinearity, the CPD detection system 1500, as well as of the method 160 of the present invention can be envisioned by those skilled in the art. These modifications include, but are not limited to, substitutions of elements for known equivalents performing a similar function in a similar way to obtain substantially the same result. For this reason one is cautioned not to limit the invention to the disclosed embodiments, but rather encouraged to determine the scope of the concept only with reference to the following claims.

What is claimed is:

1. An apparatus for determining a cable length between a test point and a source of nonlinearity in a cable plant for propagating upstream and downstream signals, the apparatus comprising:
    a peak detector for providing a triggering signal upon detection of a downstream signal peak at the test point of the cable plant;
    a waveform acquisition unit coupled to the peak detector, for acquiring, upon receiving the triggering signal from the peak detector, a waveform of the upstream signal at the test point; and
    a processing unit coupled to the waveform acquisition unit, for averaging upstream waveforms acquired by the waveform acquisition unit upon triggering by the peak detector, to obtain an averaged waveform of the upstream signal; for detecting an upstream signal peak in the averaged waveform of the upstream signal, wherein the upstream signal peak is an average of common path distortion upstream signal peaks induced at the source of nonlinearity by downstream signal peaks detected by the peak detector; and for determining the cable length between the test point and the source of nonlinearity, from a position of the upstream signal peak in the averaged waveform of the upstream signal.

2. An apparatus of claim 1, wherein the peak detector has a comparator for comparing an amplitude of the downstream signal to a pre-defined threshold value, and for providing the triggering signal to the waveform acquisition unit when the downstream signal amplitude exceeds the pre-defined threshold value.

3. An apparatus of claim 2, wherein the comparator includes a circuit for detecting positive downstream signal peaks, and a circuit for detecting negative downstream signal peaks.

4. An apparatus of claim 1, wherein the waveform acquisition unit includes an analog to digital converter (ADC) for digitizing the upstream signal at the test point, and a memory buffer coupled to the ADC, for storing the waveform of the upstream signal upon receiving the triggering signal from the comparator.

5. An apparatus of claim 4, wherein the ADC has a sampling frequency that is at least twice higher than a highest frequency of the upstream signals.

6. An apparatus of claim 1, wherein the processing unit includes an averaging unit for averaging waveforms acquired by the waveform acquisition unit.

7. An apparatus of claim 6, wherein the processing unit further includes a calculation unit suitably programmed for detecting an upstream signal peak in the averaged waveform of the upstream signal, and for determining the cable length between the test point and the source of nonlinearity from the position of the upstream signal peak in the averaged waveform of the upstream signal.

8. An apparatus of claim 1, wherein the cable plant is a coaxial cable plant of a hybrid fiber-coax network having an optical fiber link operationally coupled to the coaxial cable plant, and wherein the apparatus further comprises a delay unit disposed between the peak detector and the waveform-acquisition unit, for delaying the triggering signal by a delay time corresponding to a time of propagation of a signal in the optical fiber link.

9. An apparatus for detecting a common path distortion signal in a cable plant for propagating downstream channel signals in a downstream spectral band and upstream channel signals in an upstream spectral band, the apparatus comprising:
- a comparator for providing trigger pulses upon detecting high-magnitude downstream electrical pulses due to a constructive superposition of the downstream channel signals in the downstream spectral band, by comparing an electrical signal amplitude in the downstream spectral band to a pre-defined threshold value, and by generating a trigger pulse when the signal amplitude in the downstream spectral band exceeds the pre-determined threshold value;
- an analog to digital converter (ADC) for digitizing, at a clock frequency, an electrical signal in the upstream spectral band;
- a memory buffer coupled to the ADC, for storing, upon receiving the trigger pulses from the comparator, waveforms of the digitized electrical signal; and
- an averaging unit coupled to the memory buffer, for averaging the waveforms stored in the memory buffer, so as to obtain an averaged waveform of the electrical signal in the upstream spectral band, wherein in operation, the averaged waveform has a peak corresponding to common-path distortion signals induced by the high-magnitude downstream electrical pulses detected by the comparator.

10. An apparatus for detecting a common path distortion of claim 9, wherein:
- the electrical signals are at the test point; and
- a calculation unit is coupled to the averaging unit, for determining a position of the peak in the averaged waveform, and for determining the cable length between the test point and the source of common path distortion, from the determined position of the peak in the averaged waveform.

11. An apparatus of claim 10, further comprising a trigger controller for providing a polarity signal,
wherein in operation, the comparator detects positive or negative high-magnitude downstream electrical pulses, depending upon the polarity signal provided to the comparator; and
wherein in operation, the calculation unit determines the position of a positive or a negative peak in the averaged waveform, depending upon the polarity signal provided to the calculation unit.

12. An apparatus of claim 10, further including a delay unit disposed between the comparator and the memory buffer, for delaying the trigger pulses provided by the comparator to the memory buffer.

13. An apparatus of claim 12, wherein the calculation unit includes:
- a calculation circuit suitably programmed for determining the cable length between the test point and the source of common path distortion, and for determining the strength of the common path distortion signal,
wherein the calculation circuit is coupled to the averaging unit, and wherein in operation, the strength of the common path distortion signal is determined from a height of the peak in the averaged waveform; and
- a display unit coupled to the calculation circuit, for displaying the cable length between the test point and the source of common path distortion determined by the calculation circuit, and for displaying the strength of the common path distortion signal determined by the calculation circuit.

14. A method for detecting a common path distortion signal in a cable plant for propagating upstream signals in an upstream spectral band and downstream signals in a downstream spectral band, the method comprising:
- (a) using a peak detector to compare a signal amplitude in the downstream spectral band to a pre-determined threshold value, and generating a triggering pulse when the signal amplitude exceeds the pre-determined threshold value;
- (b) using a waveform acquisition unit to acquire a waveform of a signal in the upstream spectral band, upon triggering by the triggering pulse generated in step (a);
- (c) repeating steps (a) and (b);
- (d) using an averaging unit to average the waveforms acquired, to obtain an averaged waveform of the signal in the upstream signal band; and
- (e) using a waveform peak detector to detect a common path distortion signal, by detecting a peak in the averaged waveform.

15. A method of claim 14, wherein the downstream signals comprise a sum of downstream information channel signals transmitted over the cable plant, so that in step (a), the signal amplitude exceeds the pre-determined value as a result of a constructive superposition of the downstream information channel signals.

16. A method for detecting a common path distortion signal according to claim 15, wherein:
- (i) in step (a), the signal in the downstream spectral band is a signal detected at the test point; and
- (ii) the cable length between the test point and the source of common path distortion is determined from a position of the peak in the averaged waveform.

17. A method of claim 16, wherein in step (ii), the position of the peak in the averaged waveform is denoted by an integer index $n_{PEAK}$, and the cable length is determined by multiplying $n_{PEAK}$ by a constant $C_1$ to obtain a product, and by adding a constant $C_2$ to the product.

18. A method of claim 17, wherein the constant $C_2$ is selected so as to account for signal propagation delays caused by one or more selected from the group consisting of reactive modules, active modules, and cable spans of the cable plant.

19. A method of claim 16, wherein the cable plant is a coaxial cable plant of a hybrid fiber-coax network having an optical fiber link operationally coupled to the coaxial cable plant, wherein in step (a), the triggering pulse is delayed by a pre-determined delay time, to account for a signal propagation delay in the optical fiber link, and wherein in step (ii), the cable length is determined from a time delay between the triggering pulse delayed in step (a) and the peak in the averaged waveform.

20. A method of claim 14, further comprising repeating step c) at least 500 times.

* * * * *